United States Patent [19]
Gardner et al.

[11] Patent Number: 5,970,375
[45] Date of Patent: *Oct. 19, 1999

[54] SEMICONDUCTOR FABRICATION EMPLOYING A LOCAL INTERCONNECT

[75] Inventors: Mark I. Gardner, Cedar Creek; Daniel Kadosh, Austin; Thomas E. Spikes, Jr., Round Rock, all of Tex.

[73] Assignee: Advanced Micro Devices, Inc.

[*] Notice: This patent issued on a continued prosecution application filed under 37 CFR 1.53(d), and is subject to the twenty year patent term provisions of 35 U.S.C. 154(a)(2).

[21] Appl. No.: 08/851,086

[22] Filed: May 3, 1997

[51] Int. Cl.$^6$ .................................................. H01L 21/336
[52] U.S. Cl. .......................... 438/637; 438/653; 438/303; 438/626; 438/633
[58] Field of Search .................................... 257/754, 382, 257/903, 758, 915, 306, 369, 371, 383, 384, 755, 756, 757, 773, 774, 911, 905; 438/592, 597, 618, 620, 621–633, 636–638, 674–675, 688, 233, 279, 303, 197, 565, 586

[56] References Cited

U.S. PATENT DOCUMENTS

| | | | |
|---|---|---|---|
| 5,479,054 | 12/1995 | Tottri | 257/752 |
| 5,498,569 | 3/1996 | Eastep | 257/756 |
| 5,506,434 | 4/1996 | Yonemoto . | |
| 5,619,056 | 4/1997 | Kuriyama et al. | 257/369 |
| 5,631,484 | 5/1997 | Tsoi et al. | 257/756 |
| 5,666,007 | 9/1997 | Chung | 257/751 |
| 5,675,185 | 10/1997 | Chen et al. | 257/774 |
| 5,712,508 | 1/1998 | Lien et al. | 257/754 |
| 5,717,251 | 2/1998 | Hayashi et al. | 257/758 |
| 5,783,490 | 7/1998 | Tseng | 257/752 |

*Primary Examiner*—Chandra Chaudhari
*Assistant Examiner*—Thanh Nguyen
*Attorney, Agent, or Firm*—Kevin L. Daffer; Conley, Rose & Tayon

[57] ABSTRACT

An integrated circuit fabrication process is provided in which a sub-level local interconnect is formed between a gate conductor of one transistor and a junction of another transistor. The formation of a sub-level local interconnect allows for higher packing density by removing the local interconnect to a sub-level dielectrically spaced from possibly other local interconnects and from the distal interconnect normally associated with device interconnection. A semiconductor topography is provided which includes a first transistor laterally spaced from a second transistor, the transistors being arranged upon and within the substrate. An interlevel dielectric is deposited across the semiconductor topography. A portion of the interlevel dielectric is removed to form a trench. The trench is then filled with a conductive material to form a local interconnect extending horizontally above a portion of the first transistor and a portion of the second transistor. Portions of the interlevel dielectric and the local interconnect are removed in sequence while retaining the patterned masking layer. Removal of the local interconnect forms vias extending to the gate conductor of one transistor and to a junction of the other transistor, or from the gate conductor of one transistor to a junction of the same transistor. A conductive material may be deposited in these vias to form plugs therein. Further, a capping dielectric layer may be deposited upon the interlevel dielectric and contact regions may be formed which abut the plugs. Therefore, distal interconnect conductive layers may then be formed dielectrically above the local interconnect which are then electrically coupled to the local interconnect through the contact regions.

13 Claims, 6 Drawing Sheets

SEMICONDUCTOR FABRICATION EMPLOYING A LOCAL INTERCONNECT

BACKGROUND OF THE INVENTION

1. Field of the Invention

This invention relates to integrated circuit fabrication and more particularly to forming a high density multi-level metallization scheme employing localized interconnect formed prior to plug formation in order to provide routing between a pair of transistors located within a plane distal from the local interconnect.

2. Description of the Relevant Art

Fabrication of an integrated circuit involves numerous processing steps. After impurity regions have been deposited within a semiconductor substrate and gate areas defined upon the substrate, interconnect routing is placed on the semiconductor topography and connected to contact areas thereon to form an integrated circuit. The entire process of making an ohmic contact to the contact areas and routing interconnect material between ohmic contacts is described generally as "metallization". While materials other than metals are often used, the term metallization is generic in its application. It is derived from the origins of interconnect technology, where metals were the first conductors used. As the complexity of integrated circuits has increased, the complexity of the metallization structure has also increased.

Building multi-level interconnect structures is well known in the art. Multi-level interconnect structures were developed as a result of the shrinkage of active devices combined with increased demands required to accommodate interconnect routed between the active devices. In many designs, the area required to route a level of interconnect exceeds the area occupied by the active devices. Multi-level interconnect technology has therefore gained in popularity. Interconnect dispersed across several elevational levels helps reduce the overall lateral area occupied by the interconnect—leading to an increase in integrated circuit packing density.

Local interconnects are a special form of interconnect. Local interconnects are relatively short routing structures, and can be made of numerous conductive elements. A popular local interconnect comprises doped polysilicon, or reacted polysilicon termed "polycide". In whatever form, local interconnect is beneficial to the formation of multi-level interconnect structures. Local interconnect can be used to provide coupling between a gate conductor of a MOS transistor and a source or drain implant region (hereinafter "junction") of that transistor. Such coupling effectuates a diode. Local interconnect has also been used to couple a gate conductor of one transistor and a source or drain junction of another transistor. This form of coupling is prevalent in all input-output connections of, for example, standard logic cells. FIGS. 1 and 2 illustrate an example of such a local interconnect.

The circuit diagram of FIG. 1 depicts a single input forwarded into a pair of gate conductors 10 of an inverter 11. The output of inverter 1 is shown, according to one example, fed into one of the two inputs of a NOR gate 12. Local interconnect 13 is used to effectuate the interconnection between inverter 11 and NOR gate 12 by locally connecting a drain junction 14 of inverter 11 output to a gate conductor 16 of NOR gate 12.

FIG. 2 depicts the circuit diagram of FIG. 1 using logic symbols. Inverter 11 and NOR gate 12 are shown in symbolic form. FIG. 2 further demonstrates that local interconnect 13 output from inverter 11 may also be connected to a second gate conductor via possibly an extension 13a to local interconnect 13. Extension 13a can therefore route to a gate conductor of a second NOR gate 22.

The formation of a local interconnect between a gate conductor of one transistor of, for example, NOR gate 12 and a junction of another transistor of, for example, inverter 11 generally involves a plug. A plug is defined as a structure extending between conductive planes dielectrically spaced from one another. A plug can be formed by forming an opening through an insulative layer and thereafter filling the opening with a conductive plug material. The conductive plug material extends through the insulative (dielectric) layer disposed upon the two transistors and the single-crystalline substrate on which the transistors reside upon and partially within. A first plug extends through the dielectric to the gate conductor of one transistor while another plug, laterally spaced from the first plug, extends to a junction of another transistor. A conductive layer, i.e., a local interconnect, which contacts the upper surfaces of the two plugs is then formed horizontally above the dielectric layer. The local interconnect therefore extends from above one plug to an area above the other plug. The plugs serve as intermediaries between the overlying interconnect and the underlying gate conductor and underlying junction.

A problem with the above-mentioned method for the formation of such a local interconnect is that the plugs occupy one level of the multi-level integrated circuit while the local interconnect occupies another level. The local interconnect occupies space which could better be used for additional routing of distally extending interconnect, such interconnect defined as routing runs which extend across, for example, the entire or a substantial portion of the integrated circuit die. By placing the local interconnect in a plane common to distally extending interconnect, the area available to the distal interconnect is limited. Thus, the packing density of the integrated circuit is somewhat sacrificed by the local interconnect and associated plugs. Moreover, no means is provided for other interconnect structures to communicate with the local interconnect. Packing density around the local interconnect is then further limited. These limitations on density prevent an increase in circuit speed as well as an increase in circuit complexity. It is therefore desirable that a semiconductor fabrication process be developed for the formation of a local interconnect which allows for higher density layout of advanced ULSI integrated circuits containing local interconnect.

SUMMARY OF THE INVENTION

The problems outlined above are in large part solved by the fabrication process of the present invention. That is, a method for forming a local interconnect is provided in which the integrated circuit employing local interconnect contains densely packed interconnect devices around the local interconnect. The local interconnect is preferably arranged in a plane separate from distal extending interconnect. The local interconnect is said to be in a sub-level between the distal extending interconnect and the plane of active and passive devices. Removing the local interconnect from the distal interconnect frees more lateral area for routing of more metal lines substantial distances across the distal interconnect plane. A layout design resulting from the elevationally removed local interconnect allows for a higher density integrated circuit.

According to one embodiment, a semiconductor topography is provided which has two transistors laterally spaced from one another. An interlevel dielectric is deposited upon the semiconductor topography. A portion of the interlevel dielectric is removed to form a trench extending horizontally above a portion of the gate conductor of one of the transistors and a portion of a source/drain junction of the other transistor. A metal layer is then blanket deposited across the upper surface of the interlevel dielectric and within the trench. Chemical-mechanical polishing may be used to remove portions of the metal layer except for metal bounded exclusively within the trench. The remaining metal forms a local interconnect only within the trench formed in the interlevel dielectric.

Portions of the local interconnect and the interlevel dielectric can then be removed to form an opening (i.e., first via) extending to the gate conductor of one transistor and another opening (i.e., second via) extending to a junction of another transistor. Plugs are formed within the vias by depositing conductive material therein. Another dielectric layer (i.e., capping dielectric) may be deposited upon the interlevel dielectric and the local interconnect either before or after removing portions of the local interconnect and interlevel dielectric. Portions of the capping dielectric may be removed to form vias extending to the plugs, and conductive material may be deposited into the vias located in the capping dielectric layer. The local interconnect may terminate between the two plugs or beyond at least one of the plugs, to provide an electrical conduit between the plugs and possibly to a distal extending interconnect formed upon the capping dielectric. The distal interconnect is therefore configured in a plane spaced by the capping dielectric above the local interconnect.

The present invention exhibits advantageous features compared to conventional methods of semiconductor fabrication. For example, the local interconnect and the plugs occupy one level of a multi-level integrated circuit. Thus, the plugs and the local interconnect form a densely packed localized interconnect mechanism. Further, since the local interconnect may extend horizontally beyond at least one of the plugs, a receptor region exists upon the local interconnect to which another plug may extend through the capping dielectric between the distal interconnect and the receptor. Thus, the present local interconnect accommodates connection between distal interconnect formed above the capping dielectric and devices formed below the interlevel interconnect. The distal interconnect preferably extend horizontally to other plugs/contact regions located relatively long distances across the integrated circuit. Some of these plugs/contact regions terminate at other gate conductors or other junctions of transistors laterally spaced from the locally contacted pair. Therefore, several interconnect structures may be formed around the local interconnect dielectrically spaced between the active regions and the distal interconnect to provide high packing density.

BRIEF DESCRIPTION OF THE DRAWINGS

Other objects and advantages of the invention will become apparent upon reading the following detailed description and upon reference to the accompanying drawings in which:

FIG. 7a is a cross-sectional view of the semiconductor topography, wherein portions of the dielectric layer, the local interconnect, and the interlevel dielectric are removed in sequence to form a first via extending to a gate conductor of one transistor and a second via extending to a junction of another transistor, subsequent to the step in FIG. 6a;

FIG. 8a is a cross-sectional view of the semiconductor topography, wherein a conductive material is configured exclusively within the first via and the second via to form respective first and second plugs, subsequent to the step in FIG. 7a;

Figure 1:
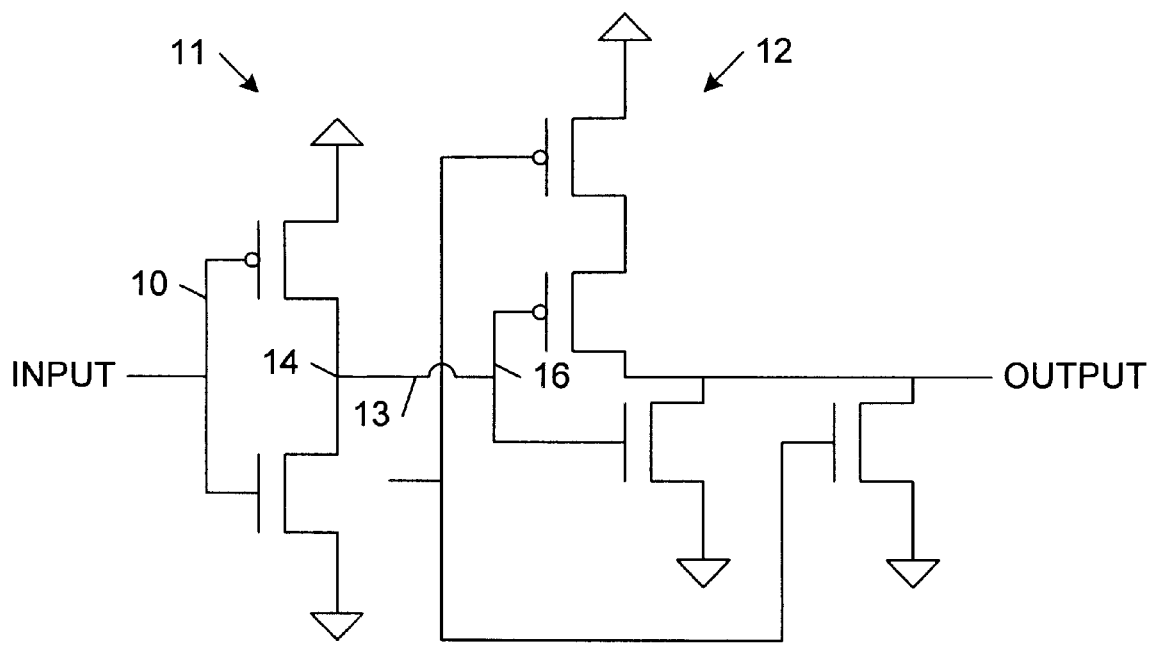
FIG. 1 depicts a circuit level diagram having a drain region output of one transistor connected to a gate conductor input of another transistor.
Figure 2:
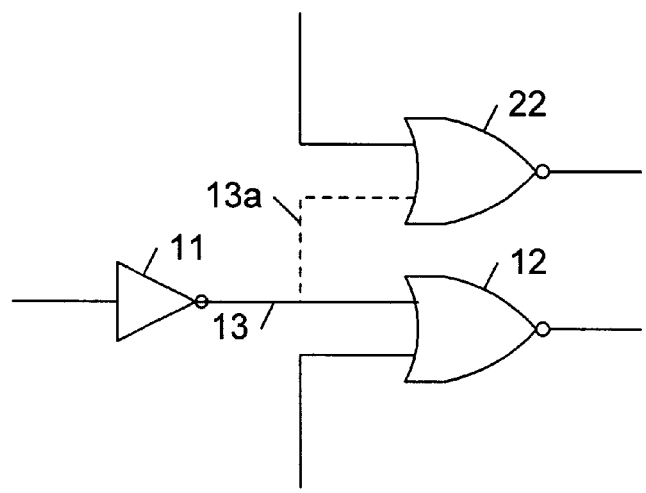
FIG. 2 depicts a logic level diagram corresponding in part to the circuit level diagram of FIG. 1.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 3:
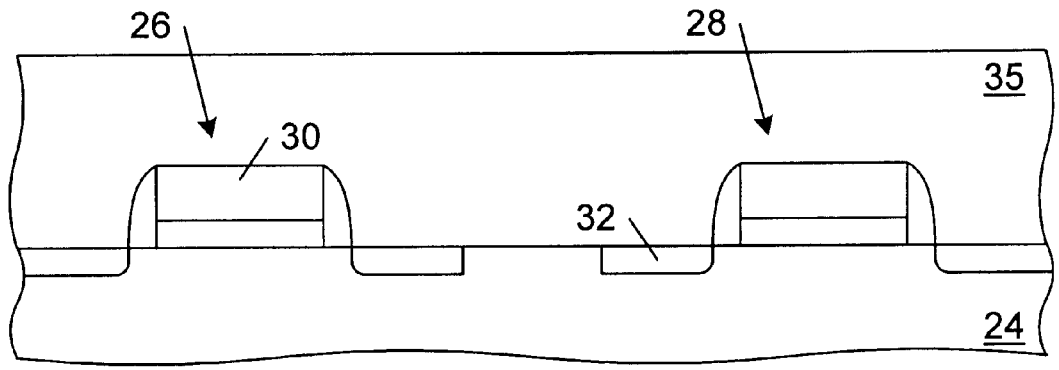
FIG. 3 is a cross-sectional view of a semiconductor topography embodying a pair of transistors laterally spaced from one another, wherein an interlevel dielectric is deposited across the semiconductor topography.

Turning to FIG. 3, a semiconductor topography 24 is depicted in which a transistor 26 is laterally spaced from another transistor 28. Transistor 26 includes a gate conductor 30, and transistor 28 includes a junction 32. Electrical coupling between gate conductor 30 and junction 32 is desirable. Junction 32 may be either a source or a drain region formed by doping a region of a single crystalline silicon substrate. Deposited upon topography 24 is an interlevel dielectric 35. Interlevel dielectric 35 is composed of silicon dioxide but may comprise other insulating materials as well. Various methods may be used to form interlevel dielectric 35, including deposition of an oxide- or glass-based material.

Figure 4:
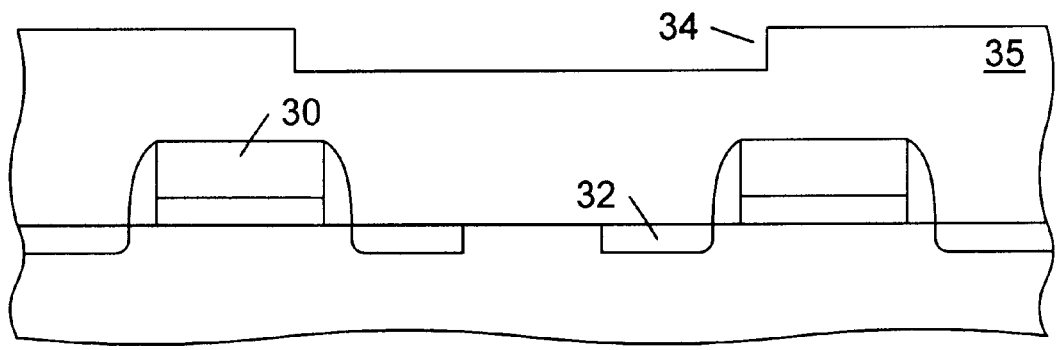
FIG. 4 is a cross-sectional view of the semiconductor topography, wherein a portion of the interlevel dielectric is removed to form a trench subsequent to the step in FIG. 3.
Figure 5:
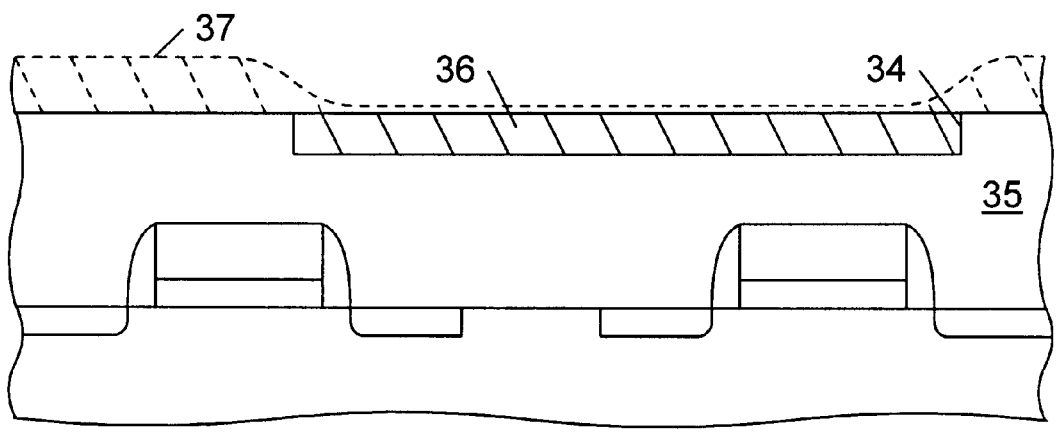
FIG. 5 is a cross-sectional view of the semiconductor topography, wherein a conductive material is arranged exclusively within the trench to form a local interconnect subsequent to the step in FIG. 4.

As depicted in FIG. 4, a trench 34 is formed within interlevel dielectric 35 by selectively etching a portion of interlevel dielectric 35. Trench 34 extends along a horizontal plane above at least a portion of gate conductor 30 and junction 32. Trench 34 is formed by photolithography, involving a patterned masking layer which selectively exposes an upper surface of interlevel dielectric 35. The etch process involves either a wet chemical etch or a dry, plasma etch. Etch duration is chosen to terminate a defined distance into the interlevel dielectric, before reaching the topography beneath the interlevel dielectric. FIG. 5 depicts formation of a local interconnect 36 bounded within trench 34. Local interconnect 36 may be formed by blanket depositing a conductive material across interlevel dielectric 35 and within trench 34 as depicted by dashed line 37. Chemical-mechanical polishing is then preferably performed to remove the conductive material from interlevel dielectric 35 outside trench 34. What remains is conductive material exclusively bound within trench 34. The upper surface of the conductive material shown as local interconnect 36 is preferably at the same elevation level as the upper surface of interlevel dielectric 35 outside trench 34. Polishing is chosen to make the surface elevation levels equal (i.e., flush with one another). The conductive material may be composed of a metal having a lower conductivity than aluminum, e.g., tungsten or tungsten alloy, since higher conductivity is not necessarily needed given the relatively short lateral distance it entails.

Figure 6A:
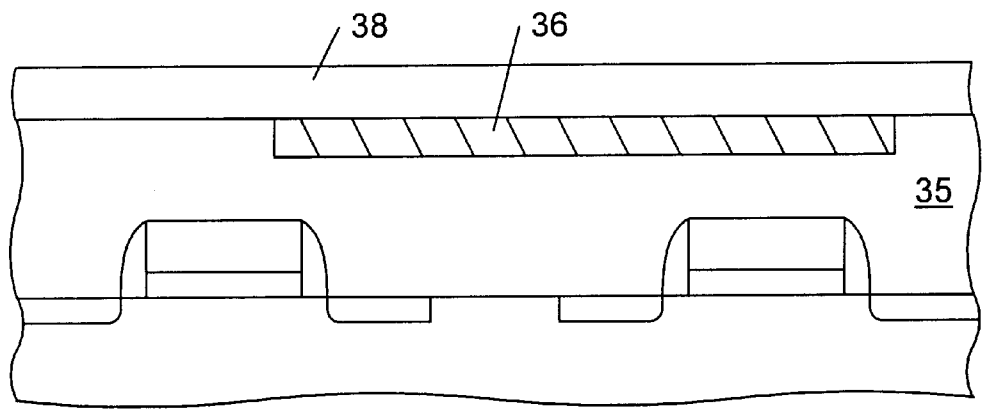
FIG. 6a is a cross-sectional view of the semiconductor topography, wherein a capping dielectric is deposited upon the local interconnect and the interlevel dielectric, subsequent to the step in FIG. 5, to render the local interconnect at a sub-level region according to one embodiment.
Figure 7A:
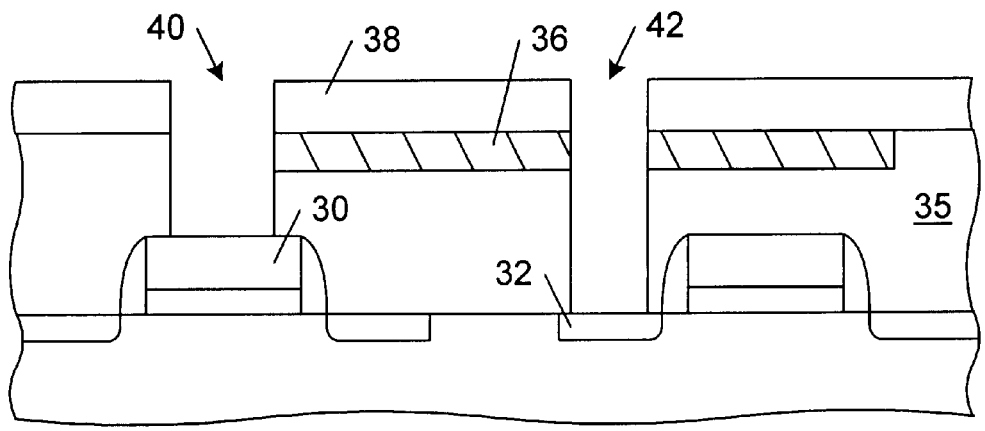

Subsequent to the formation of local interconnect 36, two separate and distinct process sequences may be performed. The initial step of one sequential embodiment is depicted in FIG. 6a. A capping dielectric 38 may be deposited upon interlevel dielectric 35 and interconnect 36. Like interlevel dielectric 35, capping dielectric 38 may comprise various insulating materials and may be formed using different methods. As depicted in FIG. 7a, portions of capping dielectric 38, local interconnect 36, and interlevel dielectric 35 are sequentially removed to form a first via 40 and a second via 42. This removal involves etching. Since different types of chemicals, i.e., etchants, are required to remove different materials, selective portions of capping dielectric 38, local interconnect 36, and interlevel dielectric 35 are etched separately. Of benefit, however, is retention of the patterned masking layer throughout the etching sequence. The vias formed above and below the sub-level local interconnect 36 are formed by an efficient use of the masking layer, all within a single etch sequence. Via 40 extends through both dielectrics 38 and 35 to gate conductor 30 while via 42 extends through dielectrics 38 and 35, as well as local interconnect 36, to junction 32.

Figure 8A:
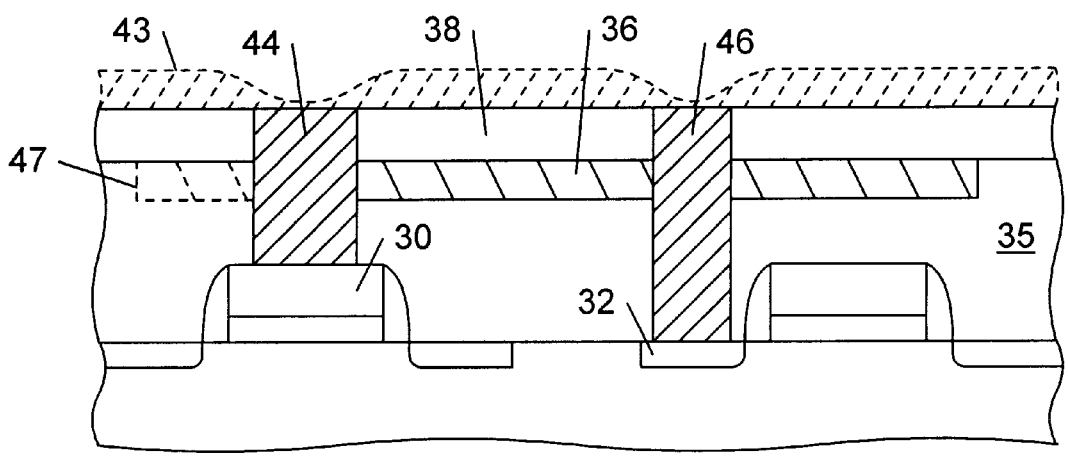

FIG. 8a illustrates that a first plug 44 and a second plug 46 are concurrently formed within via 40 and via 42, respectively. In order to form plug 44 and plug 46, a conductive material such as tungsten must first be blanket deposited across capping dielectric 38 and within via 40 and via 42. This deposition is depicted by dashed line 43. Chemical-mechanical polishing may then be used to remove the conductive material from the surface of capping dielectric 38. The capping dielectric 38 is thus flush with the surfaces of plug 44 and plug 46. One section of local interconnect 36 extends horizontally between plug 44 and plug 46, and abuts the plugs at their sides. Thus, plug 44, plug 46, and interconnect 36 are located in the same level of a multi-level integrated circuit. Another section of local interconnect 36 extends beyond plug 46 to act as a possible receptor for vias which may later be drawn down to this section. Additionally or alternately, a section of local interconnect 36 may be formed such that it extends beyond plug 44, as illustrated by dashed line 47. Plug 44 and plug 46 allow input/output connection between gate conductor 30 and junction 32 of dissimilar transistors to be electrically coupled with local interconnect 36.

Figure 6B:
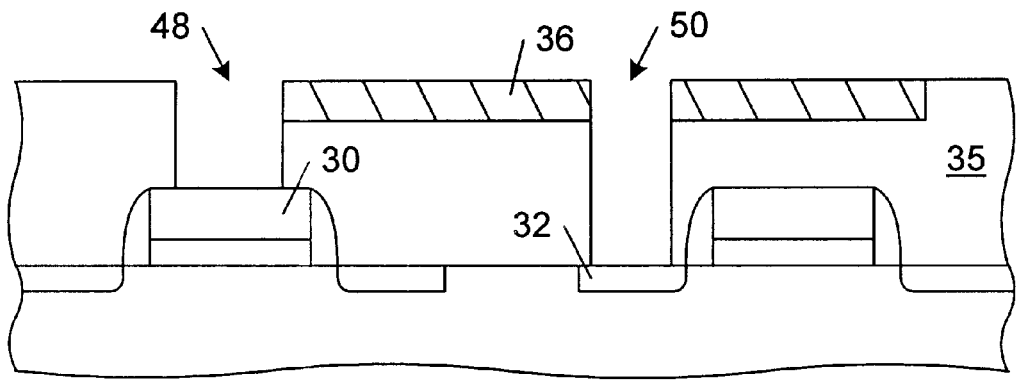
FIG. 6b is a cross-sectional view of the semiconductor topography, wherein portions of the local interconnect and the interlevel dielectric are removed to form a first via extending to a gate conductor of one transistor and a second via extending to a junction of another transistor, subsequent to the step in FIG. 5, according to another embodiment.
Figure 7B:
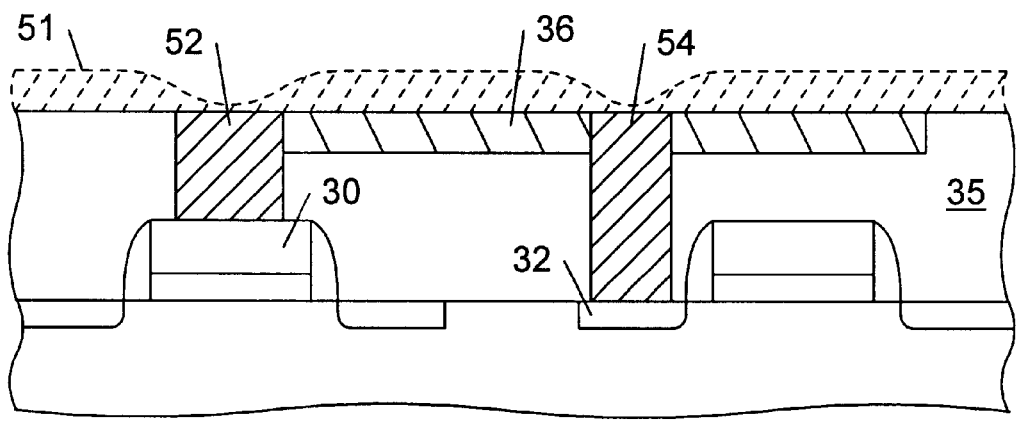
FIG. 7b is a cross-sectional view of the semiconductor topography, wherein a conductive material is deposited within the first via and the second via to form respective first and second plugs, subsequent to the step in FIG. 6b.
Figure 8B:
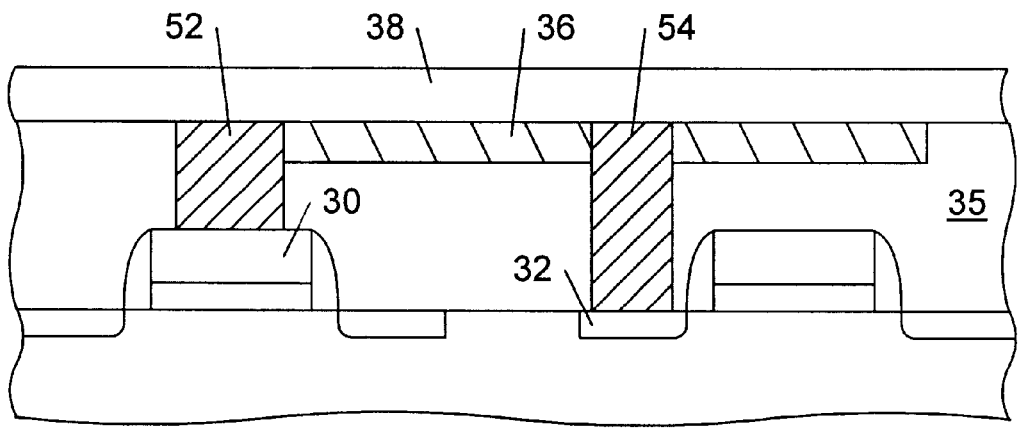
FIG. 8b is a cross-sectional view of the semiconductor topography, wherein a capping dielectric is deposited upon the interlevel dielectric, the local interconnect, and the first and second plugs, subsequent to the step in FIG. 7b.

FIG. 6b depicts another embodiment of the present invention, subsequent to the formation of local interconnect 36 in FIG. 5. Portions of local interconnect 36 and interlevel dielectric 35 are removed in sequence while the patterned masking layer (not shown) is retained. Sequential removal will likely involve dissimilar etch species for use with the dissimilar materials being etched. Thus, a first via 48 and a second via 50 are formed through interlevel dielectric 35 and extend to gate conductor 30 and junction 32, respectively. Turning to FIG. 7b, a conductive material is then deposited across interlevel dielectric 35 and into via 48 and via 50 as shown by dashed line. Thus, a plug 52 and a plug 54 become bounded within via 48 and via 50. FIG. 8b illustrates that a capping dielectric 38 may be deposited across interlevel dielectric 35, plugs 52 and 54, and local interconnect 36 to render the local interconnect at a sub-level between capping dielectric 38 and interlevel dielectric 35.

Figure 9:
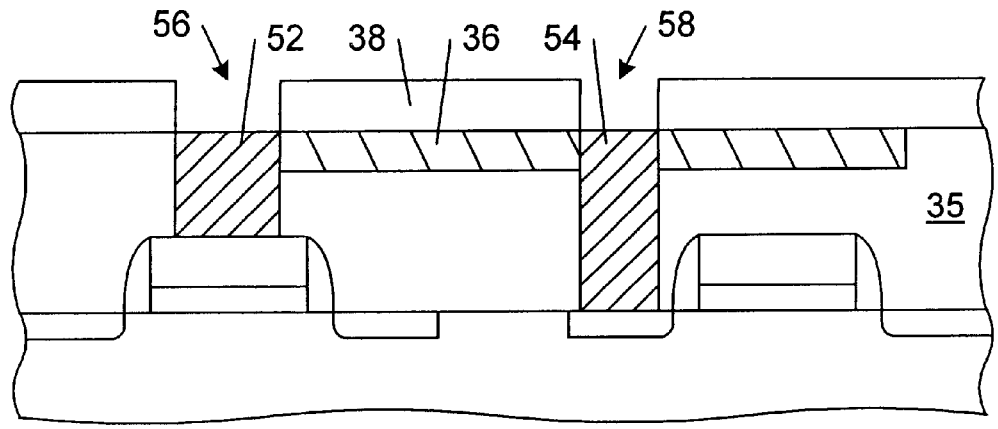
FIG. 9 is a cross-sectional view of the semiconductor topography, wherein portions of the capping dielectric are removed to form vias extending to the first plug and the second plug, subsequent to the step in FIG. 8b.
Figure 10:
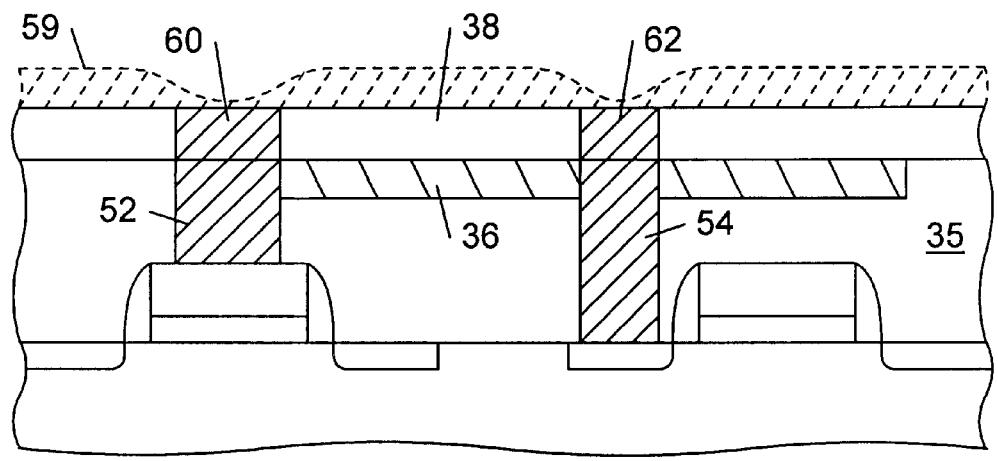
FIG. 10 is a cross-sectional view of the semiconductor topography, wherein a conductive material is deposited into the vias to form contact regions through the capping dielectric, subsequent to FIG. 9.

As shown in FIG. 9, portions of capping dielectric 38 may then be removed to form via 56 and via 58 by selective etch thereof. Via 56 extends to plug 52, and via 58 extends to plug 54. Third and fourth plugs 60 and 62 may then be formed within vias 56 and 58, respectively, as shown in FIG. 10. The formation of plugs 60 and 62 may involve blanket depositing a conductive material within vias 56 and 58 and across capping dielectric 38 as depicted by dashed line 59. Then a portion of the conductive material may be removed using chemical-mechanical polishing such that it remains exclusively within vias 56 and 58. The semiconductor topography of FIG. 10 is the same as that of FIG. 8a but is formed in a different manner.

Figure 11A:
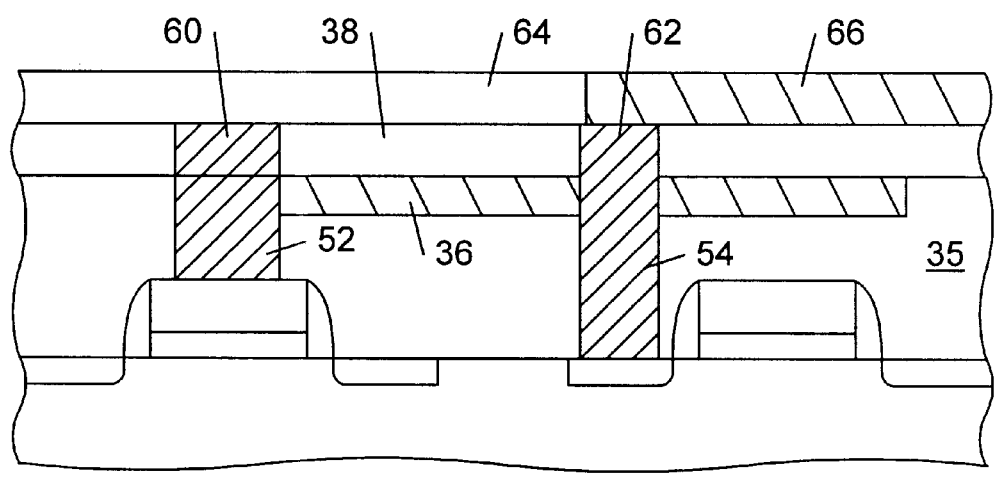
FIG. 11a is a cross-sectional view of the semiconductor topography, wherein a conductive layer is formed above the capping dielectric such that the conductive layer abuts the contact region lying only above the second plug, according to one embodiment of the present invention.
Figure 11B:
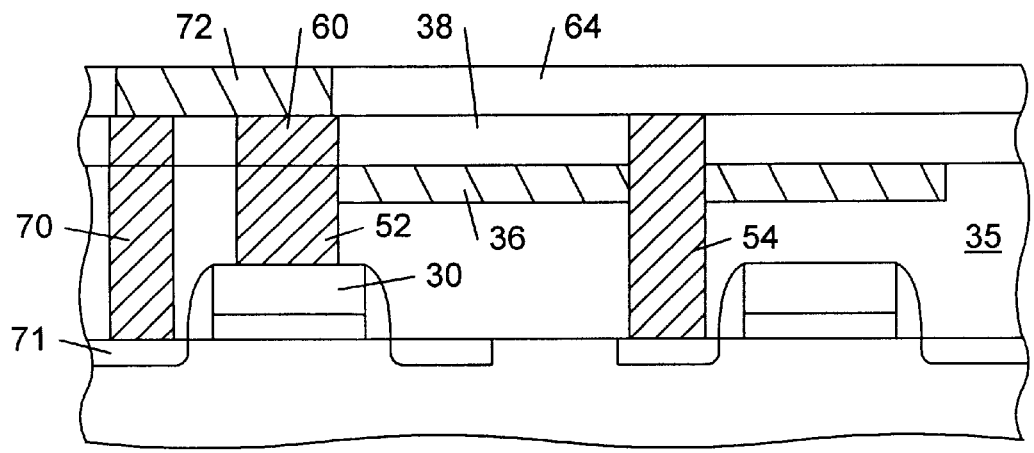
FIG. 11b is a cross-sectional view of the semiconductor topography from FIG. 10, wherein a third plug is formed which terminates at a junction of one transistor, and wherein a conductive layer is formed above the capping dielectric such that the conductive layer abuts only the first and third plugs, according to another embodiment.
Figure 11C:
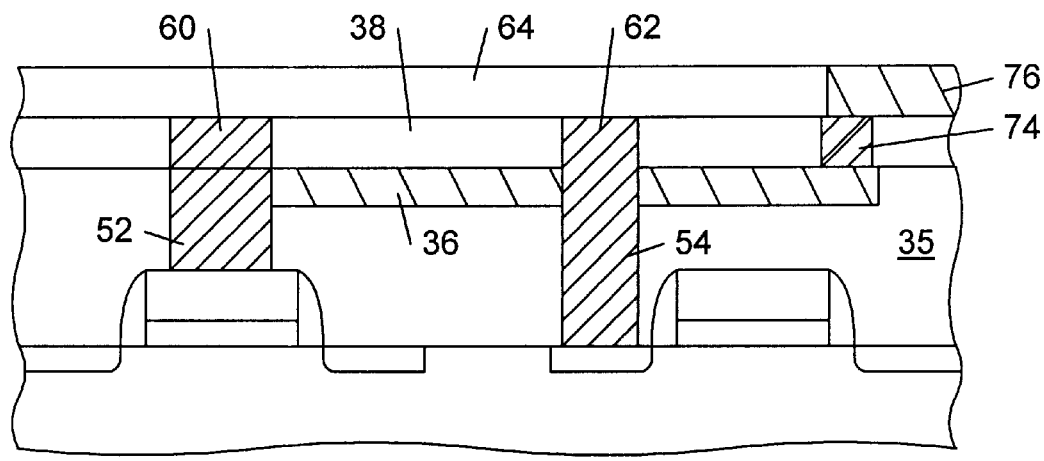
FIG. 11c is a cross-sectional view of the semiconductor topography from FIG. 10, wherein a contact region is formed above a portion of the local interconnect through the capping dielectric, and wherein a conductive layer is formed above the capping dielectric such that the conductive layer abuts the contact region, according to another embodiment.

FIGS. 11a, 11b, and 11c depict the formation of other interconnect structures (i.e., distal interconnect) that communicate with local interconnect 36 and underlying transistors, according to different embodiments. The addition of distal interconnect on a dissimilar elevation plane from the local interconnect provides an even higher packing density around local interconnect 36. FIG. 11a depicts the formation of another dielectric layer 64 across capping dielectric 38 and plugs 60 and 62. A portion of dielectric layer 64 may then be removed. A conductive material, such as aluminum is preferably blanket deposited across interlevel dielectric 38 and into the removed portion of dielectric layer 64. Chemical-mechanical polishing of the conductive material is performed to form conductive layer 66 exclusively within the removed portion of dielectric layer 64. Conductive layer 66, when patterned, presents a distal interconnect dielectrically spaced above local interconnect 36 except for plugs placed therebetween. Distal interconnect 66 abuts contact region 62 and is therefore electrically coupled to local interconnect 36 as well as to junction 32. Distal interconnect 66 may extend to other plugs/contacts (not shown) located at a region, distally removed from that shown, to produce an overall electrical interconnection across the entire integrated circuit.

FIG. 11b depicts that more plugs may be formed through interlevel dielectric 35 and capping dielectric 38. A portion of interlevel dielectric 35 may be removed by etch thereof and then filled with a conductive plug material, e.g., tungsten, using blanket deposition followed by chemical-mechanical polishing. Thus, a plug 70 is formed concurrently through a via which extends from above dielectric layer 38 to, e.g., junction 71. A portion of dielectric layer 64 may be removed and then filled with a deposited conductive material, such as tungsten to form conductive layer 72. Conductive layer 72 abuts plug 70 and contact region 60, thereby forming a local interconnect between junction 71 and gate conductor 30 or between junction 71 and local interconnect 36. FIG. 11b thereby shows a local interconnect dielectrically spaced from another local interconnect, both of which are arranged in separate sub-levels relative to the transistor plane and the distal interconnect plane.

FIG. 11c illustrates a contact formed through capping dielectric 38 to local interconnect 36. A portion of capping dielectric 38 may be etched away and then filled with a conductive material, such as tungsten using blanket deposition followed by chemical-mechanical polishing, thereby forming a plug 74. Plug 74 abuts a portion of local interconnect 36 which extends beyond plug 54 such that local interconnect 36 acts as a receptor for overlying contact region 74. A portion of dielectric layer 64 may be removed and filled with a conductive material to form conductive layer 76. Conductive layer 76 is defined as a distal interconnect which abuts contact region 74 and extends to other plugs/contacts distally arranged across the integrated circuit (not shown) to form an overall integrated circuit interconnect.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A method for forming an interconnect, comprising:
    providing a first transistor laterally spaced from a second transistor within a semiconductor topography, wherein said first transistor comprises a gate conductor and said second transistor comprises a junction;
    depositing an interlevel dielectric upon said semiconductor topography;
    removing a portion of said interlevel dielectric to form a trench extending horizontally above at least a portion of said gate conductor and said junction;
    forming a local interconnect exclusively within said trench;
    removing select portions of said local interconnect and said interlevel dielectric to form a first via extending to said gate conductor and a second via extending to said junction; and
    depositing a conductive material within said first via and said second via to form a respective first plug and a second plug, wherein said first plug provides electrical communication between the gate conductor and the local interconnect, and wherein the second plug provides electrical communication between the junction and the local interconnect.

2. The method as recited in claim 1, wherein said junction comprises a source or drain region of said second transistor.

3. The method as recited in claim 1, wherein said local interconnect extends across a substantially horizontal plane between said first plug and said second plug.

4. The method as recited in claim 1, wherein said local interconnect extends across a substantially horizontal plane and terminates a distance beyond said first plug such that a receptor extending beyond said first plug is formed.

5. The method as recited in claim 4, further comprising forming a distal interconnect dielectrically spaced partially above and parallel to said local interconnect.

6. The method as recited in claim 5, further comprising forming a contact extending between said local interconnect and said distal interconnect, said contact being adjacent an upper surface of said receptor.

7. The method as recited in claim 1, wherein said local interconnect extends across a substantially horizontal plane and terminates a distance beyond said second plug such that a receptor extending beyond said first plug is formed.

8. The method as recited in claim 7, further comprising forming a distal interconnect dielectrically spaced partially above and parallel to said local interconnect.

9. The method as recited in claim 8, further comprising forming a contact extending between said local interconnect and said distal interconnect, said contact being adjacent an upper surface of said receptor.

10. The method as recited in claim 1, wherein said local interconnect is in mutual electrical communication with said gate conductor and said junction.

11. The method as recited in claim 1, further comprising:
    depositing a capping dielectric upon said local interconnect, said interlevel dielectric and said first and second plugs;
    removing portions of said capping dielectric to said local interconnect; and
    forming a layer of distal interconnect across said capping dielectric and into the removed portions of said capping dielectric.

12. The method as recited in claim 1, further comprising:
    depositing a capping dielectric upon said local interconnect and interlevel dielectric;
    concurrent with said removing select portions of said local interconnect and said interlevel dielectric, removing a portion of said capping dielectric to expose a portion of said gate conductor and said junction; and concurrent with depositing said conductive material within said first via and said second via, depositing said conductive material in said removed portion of said capping dielectric.

13. The method as recited in claim 1, wherein forming said local interconnect within said trench comprises (1) blanket depositing a metal layer across said interlevel dielectric and within said trench and (2) removing portions of said metal layer exclusive of within said trench by using chemical mechanical polishing.

* * * * *